United States Patent [19]

Gerlach

[11] Patent Number: 4,882,487
[45] Date of Patent: Nov. 21, 1989

[54] DIRECT IMAGING MONOCHROMATIC ELECTRON MICROSCOPE

[75] Inventor: Robert L. Gerlach, Minnetonka, Minn.

[73] Assignee: The Perkin-Elmer Corporation, Norwalk, Conn.

[21] Appl. No.: 268,440

[22] Filed: Nov. 8, 1988

Related U.S. Application Data

[63] Continuation-in-part of Ser. No. 58,437, Jun. 5, 1987, Pat. No. 4,810,880.

[51] Int. Cl.$^4$ ............................................. H01J 37/285
[52] U.S. Cl. ...................................... 250/306; 250/305; 250/310
[58] Field of Search ................. 250/306, 305, 307, 310

[56] References Cited

U.S. PATENT DOCUMENTS 4,758,723  7/1988  Wardell et al. ...................... 250/307
4,810,880  3/1989  Gerlach ................................ 250/305

OTHER PUBLICATIONS

Wincott et al., J. Phys. E: Sci. Instrum. 22 (1989) pp. 42–47.

Primary Examiner—Jack I. Berman
Attorney, Agent, or Firm—E. T. Grimes; H. S. Ingham

[57] ABSTRACT

A direct-imaging, monochromatic electron microscope includes an objective lens for collecting a substantial portion of emitted electrons from an area across a sample surface, and focusing the electrons through an image plane. A collimating lens for collimating the electrons into beams is located at its focal distance from the image plane. An energy filter with an entrance aperture is receptive of the beams to transit monochromatic beams, and a transfer lens is receptive of the monochromatic beams for refocusing the same through a projection lens to effect an image of the plurality of spots in a projection plane. The objective lens is formed of a magnetic toroidal coil having a central hole therein with a dish-shaped magnetically permeable member cupped coaxially over the toroidal coil. The permeable member has a neck portion protruding through the central hole. The sample surface is interposed proximate the objective lens between the objective lens and the energy filter. The entrance aperture is positioned from the transfer lens by approximately a distance optically conjugate to the distance between the objective lens and the collimating lens.

9 Claims, 2 Drawing Sheets

DIRECT IMAGING MONOCHROMATIC ELECTRON MICROSCOPE

This is continuation-in-part of co-pending application Ser. No. 058,437 filed June 5, 1987 now U.S. Pat. No. 4,810,880.

The present invention relates generally to the field of electron microscopes and particularly to a direct imaging monochromatic electron microscope useful for X-ray photoelectrons and Auger electrons.

BACKGROUND OF THE INVENTION

A variety of electron microscopes and associated surface analyzers have evolved in recent years. General background is given, for example, in *Introduction to Analytical Electron Microscopy*, Plenum Press (New York 1979). A popular type is a scanning electron microscope in which a focused electron beam is scanned over a sample surface with secondary electrons being detected in correlation with scanning position and processed electronically to provide a picture of topographical features. Associated mapping of chemical constituents in the surface is achieved with characteristic X-rays produced by the electron beam. However, resolution from the X-rays is not commensurate with the topographical resolution. Also, X-rays are not suitable for detecting elements with low atomic numbers or for near surface sensitivity.

Another method for analyzing surfaces is with secondary Auger electrons generated at the sample surface by the focused primary electron beam. Auger microprobes are suitable for detecting elements with low atomic numbers and have sensitivity to a few atomic layers. Surface mapping of elements is accomplished by scanning with the primary electron beam. An example of a scanning Auger microprobe is provided in U.S. Pat. No. 4,048,498 (Gerlach et al). Scanning Auger is limited in analysis area to about 500 angstroms diameter by scattering of the primary beam in the surface region.

Another approach to surface analysis is electron spectroscopy for chemical analysis (ESCA) which involves irradiating a sample surface with X-rays and detecting the characteristic photoelectrons emitted. The photoelectrons are filtered by electrostatic or magnetic means which allow only electrons of a specified energy to pass through. The intensity of the resulting beam reflects the concentration of a given chemical constituent of the sample surface. U.S. Pat. Nos. 3,617,741 (Siegbahn et al) and 3,766,381 (Watson) describe such a system. Chemical mapping of the surface requires moving a component or aperture to detect electrons from various parts of the surface, since X-rays generally cannot be focused sufficiently onto small areas of the surface to allow scanning with high resolution.

Therefore, continuing efforts have been directed toward direct imaging of characteristic emissions. One approach is described in "Photoelectron Microscopy—Applications to Biological Surfaces" by 0. Hayes Griffith, presented at a symposium "Small Area Solid and Surface Analysis" in New Orleans, Feb. 25Mar. 1, 1985. The system decribed therein images low energy photoelectrons from ultra-violet radiation. It is acknowledged therein that an elemental analysis is not provided. Also, imaging with higher energy electrons has been less successful because of aberrations that become more prominent.

The Griffith document, on Page 16, describes a further approach in which emitted electrons are focused with spiral tragectories along magnetic flux lines. Resolution depends on the diameter of the spiral, and it is pointed out that the main limitation is that maximum magnification, and therefore resolution, is low. Energy filtering of the electron beams is important to obtain a monochromatic beam characteristic of an element being analyzed. Electrostatic filtering may be achieved with concentric hemispherical conductors having an applied voltage therebetween, such as described in aforementioned U.S. Pat. No. 3,766,381.

A magnetic system for filtering electrons is described in "Modification of a Transmission Electron Microscope to Give Energy-Filtered Images and Diffraction Patterns, and Electron Energy Loss Spectra" by R. F. Egerton, J. G. Philip, P. S. Turner and M. J. Whelan, *Journal of Physics E: Scientific Instruments*, Volume 8, 1033-1037 (1975). This reference describes a transmission electron microscope. The energy filter is a magnetic prism cooperative with an electrostatic mirror to transit the electrons twice through the prism. Direct imaging of surface elements is achieved with relatively high energy electrons (e.g. 80 kev). However, although the filtered energies of transmitted electrons are representative of elemental constituents, this instrument utilizes specially prepared thin film samples in transmission and is not intended to analyze solid surfaces.

An instrument for imaging secondary ions from surfaces is described in "Secondary Ions Microanalysis and Energy-Selecting Electron Microscopy" by R. Castaing, *Electron Microscopv in Material Sciences*. Academic Press (New York 1971) pages 103-161. This instrument accelerates very low energy (e.g. 10 ev) secondary ions from surfaces and performs mass and energy analysis while simultaneously forming two dimensional images.

A variety of electrostatic and magnetic electron lenses are known as described, for example, in the aforementioned text by Hren et al. One such magnetic lens is a single pole piece lens described in Hren et al. on Pages 68–69 as pancake and snorkel lenses. Further details of snorkel lenses are given in "Some Properties of Single Pole Piece Objective Electron Lenses" by S. M. Juma, M. A. A. Khaliq and F. H. Antar, *Journal of Phvsics E: Scientific Instruments*, Volume 16, 1063-1068 (1983). Single pole piece lenses apparently have not evolved to be useful in practical electron microscopy.

In view of the foregoing, a primary object of the present invention is to provide an electron microscope for two dimensional imaging of moderate energy (50 to 3000 ev) secondary electrons emitted from solid surfaces, where the emitted electrons are monochromatized in the process.

Another object is to provide a novel direct imaging microscope that is particularly useful for X-ray photoelectron chemical analysis of surfaces.

A further object is to provide a novel direct imaging microscope that is particularly useful for chemical mapping with Auger electrons.

Yet another object is to provide a monochromatic electron microscope having improved collection efficiency of electrons from a sample surface.

SUMMARY OF THE INVENTION

The foregoing and other objectives are achieved according to the present invention by a direct-imaging, monochromatic electron microscope, for example for Auger electrons or x-ray photoelectrons. The microscope includes emitting means for emitting electrons from a plurality of spots across a sample surface, objective lens means for collecting a substantial portion of the emitted electrons from the sample surface and focusing the same at an image plane, and collimating lens means for collimating the substantial portion of the emitted electrons into a plurality of groups of electron beams. The microscope further includes an energy filter having an entrance aperture receptive of the groups of beams to transit monochromatic beams having a selected energy, imaging means receptive of the monochromatic beams for focusing the same to effect an image of the plurality of spots, and detector means for detecting the image.

The objective lens means has a first effective position plane, and the collimating lens means has a second effective position plane and a focal length relative to the second plane. The second plane is positioned at a first distance from the image plane equal to the focal length and at a second distance from the first plane. The entrance aperture is positioned from the second plane by approximately a third distance optically conjugate to the second distance with respect to the second plane of the collimating lens means.

The objective lens means preferably comprises a magnetic objective lens and more preferably a single pole piece objective lens formed of a magnetic field generating toroidal coil with a dish-shaped magnetically permeable member cupped coaxially over the toroidal coil. The permeable member most preferably has a neck portion extending through a central hole in the coil. The objective lens is situated to collect the substantial portion of the emitted electrons from a sample surface that is interposed proximate the objective lens and is preferably between the neck portion of the objective lens and the energy filter.

Suitable for the energy filter is a spherical analyzer of hemispherical configuration with an entrance aperture receptive of the electron beams from the focusing means and a slotted exit aperture located diametrically opposite the entrance aperture. The electron microscope also should include means for selecting the energy for the monochromatic electron beams.

DETAILED DESCRIPTION OF THE INVENTION

Figure 1:
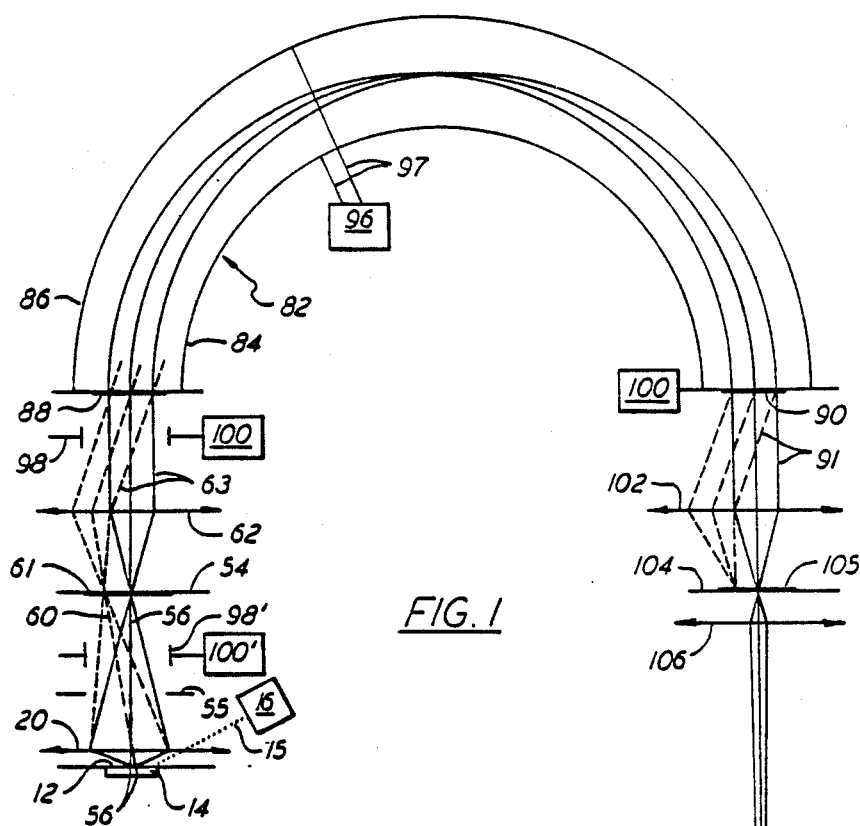
FIG. 1 is a schematic diagram of an electron microscope having components according to the present invention.

A direct imaging monochromatic electron microscope according to the present invention is illustrated schematically in FIG. 1. The system components are in appropriate enclosures (not shown) so as to operate at high vacuum. The preferred purpose of the microscope is to display a two dimensional map of a selected elemental constituent according to its concentration at or very close to a surface 12 of a sample 14. The surface is subjected in the conventional manner to a beam 15 from an energy source 16, preferably a source of electrons or X-rays.

In the case of an electron beam source it is especially useful that the beam be of suitable energy to cause Auger electrons to be emitted from the sample surface. With incident X-rays, photoelectron emission will occur and be utilized. With either of these sources or other similar situations of electron emission or transmission, the electron microscope of the present invention filters the energies of the electrons to produce and image a packet of monochromatic beams having a selected energy characteristic of a constituent element being mapped.

Figure 2:
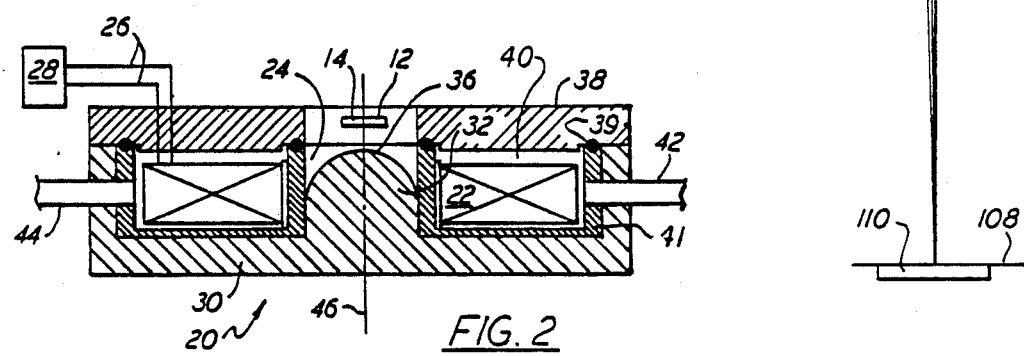
FIG. 2 is an axial cross section of an objective lens utilized in the electron microscope of FIG. 1.

The emitted electrons from surface 12 are collected by a magnetic type of objective lens 20 which is preferably of the single pole piece type, such as a pancake lens and most preferably a snorkel lens such as disclosed in the aforementioned pages 68–69 of Hren et al. and the article by Juma et al. (As used herein and in the claims, "lens" refers to an electron optical component.) Such a snorkel lens is illustrated in FIG. 2. of the present application. The snorkel objective lens includes a magnetic field generating toroidal coil 22 of wire having a central hole 24 therein. Wire leads 26 from the coil are connected to a current source 28. For example, the coil has 500 turns, and a current of 1 ampere is used.

A dish-shaped magnetically permeable member 30 is cupped coaxially over toroidal coil 22. The permeable member has a neck portion 32 with a tip 36 extending substantially through central hole 24 of the coil. As example the outer diameter of the neck is 20 mm and its overall length is 30 mm. Coolant may be needed, in which case cover plate 38 and semitoroidal member 41 of non-magnetic material such as aluminum, with 0-ring seals 39, cooperates with permeable member 30 to enclose coil 22 in a coolant chamber 40 with an inlet pipe 42 and an outlet pipe 44 for the coolant to disperse heat generated in the coil by the current.

Tip 36 of the neck of the lens is positioned toward sample surface 12. The sample, in this preferred embodiment, is outerposed between neck tip 36 and focus plane 54 as well as subsequent components to be described. Because of the charcteristics of this lens, a very wide solid angle of reception of electrons from surface 12 is practical, even approaching 60°. The magnetic field of the single pole lens is such that the electrons are focused in a first image plane 54 (FIG. 1). A magnification of about 10 is preferred.

According to principles of electron optics, groups of electron beams are focused by objective lens 20 through an objective aperture 55 into image plane 54 in a pattern in correlation with various electron-emitting spots on the sample surface. Two such groups 56,60 are shown in FIG. 1, as solid and broken lines respectively. These are shown tracing through most of the system (the broken lines are partially omitted for clarity). Aperture 55 limits aberrations from the objective lens. An orifice 61 in image plane 54 selects the electron beams for the area on surface 12 to be mapped. Although not shown, the objective lens system may include additional magnetic or electrostatic lens components of the desired or conventional type between the single pole piece lens 20 and orifice 61, particularly for Auger imaging where more magnification is often needed.

A collimating transfer lens 62 is spaced beyond image plane 54 a distance corresponding to the focal distance of the transfer lens so as to refract each group into a group of parallel electron beams. The transfer lens may be any conventional, high quality type lens, either electrostatic or magnetic, but should have a total coefficient of aberration less than 50 cm, and preferably less than 30 cm.

Figure 3:
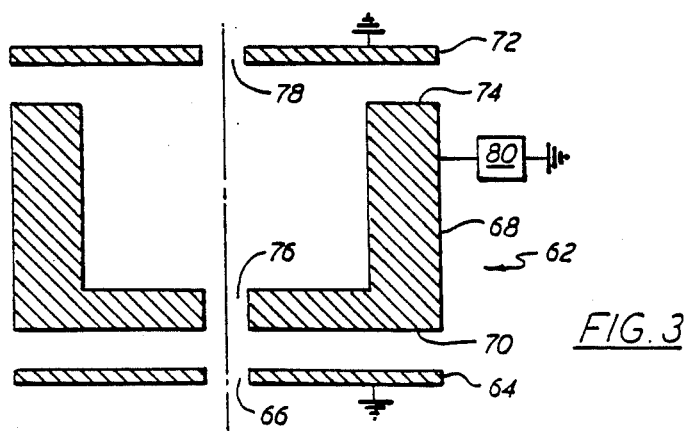
FIG. 3 is an axial cross section of a transfer lens utilized in the electron microscope of FIG. 1.

A particularly desirable transfer lens 62 is depicted in Fig. 3 and is of the type described in a document entitled "An Asymmetric Electrostatic Lens for Field Emission Microprobe Applications" by J. Orloff and L. W. Swanson (June 1978). A washer-shaped first component 64 with a first orifice 66 therein constitutes the inlet side for the beams. A cup-shaped second component 68 has a flat cup-bottom portion 70 spaced coaxially proximate to first component 64. A washer-shaped third component 72, similar to component 64, is spaced coaxially proximate the rim 74 of cup-shaped second component 68. The first, second and third components have coaxial orifices 66,76,78 of similar diameters for cooperatively passing the electrons therethrough. Lens 62 desirably is operated with the first and third components 64,72 at earth potential (i.e., generally the potential of enclosures for the system, not shown), and second component 68 at a negative voltage relative to the earth potential, from a voltage source 80.

Referring again to FIG. 1, an energy filter 82 is receptive of the electron beams to pass through (transit) corresponding monochromatic beams having a selected energy. The filter is of the known or desired type such as a prism-mirror system shown in the aforementioned article by Egerton et al. However, particularly for x-ray photoelectrons, the filter preferably is a spherical analyzer of conventional hemispherical configuration with an inner hemisphere 84 and an outer hemisphere 86. This analyzer provides large input solid angle and area necessary for x-ray photoelectron imaging.

An entrance aperture at 88 is receptive of the electron beams from the transfer lens. A slotted exit aperture at 90 lies diametrically opposite the entrance aperture.

Figure 4:
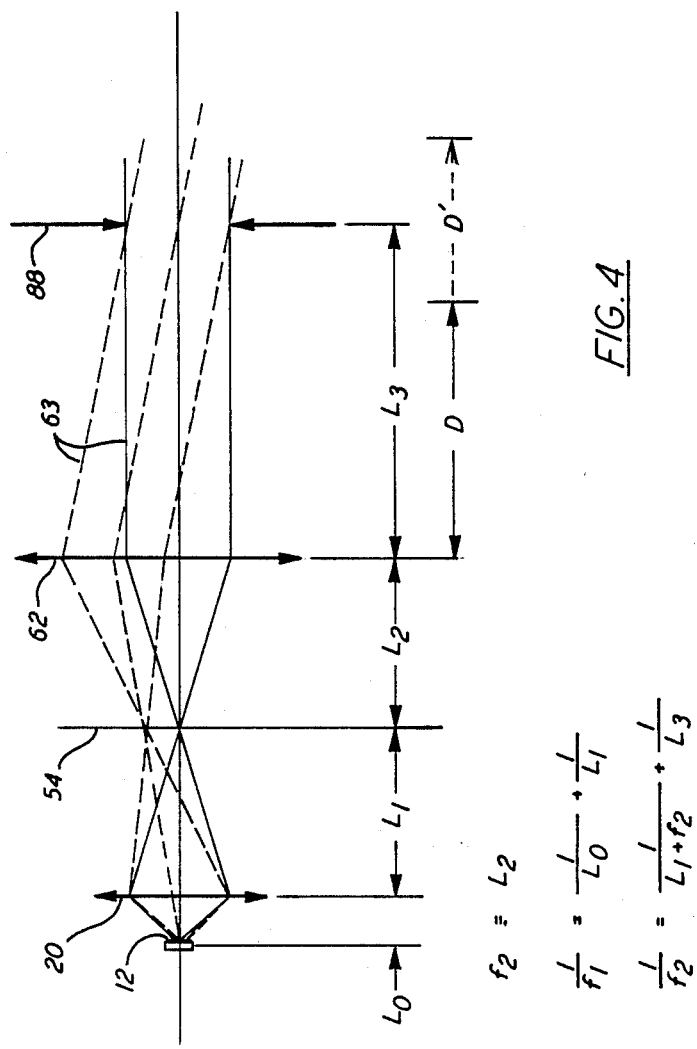
FIG. 4 is a portion of FIG. 1 showing optical relationships.

According to a preferred embodiment entrance aperture 88 has a specific position with respect to transfer lens 62, described with reference to FIG. 4. The effective focal lengths of objective lens 20 and transfer lens 62 are $f_l$ and $f_2$ respectively. It will be appreciated that these lenses may be complex but will each have an effective optical position plane 20 or 62 as indicated in the figure. The relative locations of sample surface 12 and image plane 54 relative to lens 20 are described by the standard lens formula $1/f_1 = 1/L_0 + 1/L_1$ where $L_0$ abd $L_1$ are conjugate focal distances for lens 20 relative to sample 12 and plane 54. Also, as indicated above, collimating lens 62 is disposed at a first distance $L_2$ from image plane 54 such that $L_2 = f_2$. A second distance is defined herein as the distance $(L_l + L_2)$ separating the two lens planes 20,62.

According to the present invention aperature 88 is positioned at a third distance D from lens 62 approximately equal to a distance $L_3$ which is defined such that $1/f_2 = 1/(L_1 + L_2) + 1/L_3$; i.e. $1/f_2 = 1/(L_1 + f_2) + 1/L_3$. Descriptively this means that the third distance D separating entrance aperture 88 from lens 62 is approximately conjugate optically to the second distance $(L_1 + L_2)$ separating lens 20 and lens 54. The third distance D is not highly critical, but generally should be within about 25% of distance $L_3$ as indicated by the dashed line D' portion in FIG. 4, in order that the electron beams 63 be efficiently collected by entrance aperture 88 of filter 82. Preferably distance D substantially equals distance $L_3$.

A negative deflecting voltage relative to inner hemisphere 84 is applied to outer hemisphere 86 from a voltage source 96 and lines 97. It will be recognized that beam trajectories between hemispheres 84,86 depend on electron energy and applied voltage, and only beams of a selected narrow energy range transit through exit aperture 90. Aberrations are at a minimum at the 180° hemispherical path exit.

Selecting the energy for the monochromatic electron beams is by known or desired means, for example by adjusting the applied voltage from source 96. Alternatively a conventional electron lens 98 may be used which selectively modifies the energy of the electrons received by energy filter 82. The lens may be integral with or constitute transfer lens 62. The energy modifying lens 98 is indicated schematically between transfer lens 62 and filter 82 in FIG. 1. Electronic controlling means 100 for lens 98 in cooperation with filter 82, effect the selected energy of the monochromatic beams emerging from aperture 90. Optionally, and preferably, the energy modifying lens is situated at 98' between transfer lens 62 and objective lens 20, with a controller 100'. Also one or more lenses at 98' may be used for further magnification. Suitable lenses 98 (or 98') are disclosed in aforementioned U.S. Pat. Nos. 3,766,381 and 3,617,741.

A second transfer lens 102 is positioned beyond exit aperture 90 so as to be receptive of the monochromatic beams to refocus the same. The second transfer lens may be substantially identical to the first transfer lens but oppositely oriented. Thus the second lens 102 has an outlet side from which the refocused beams emerge, corresponding structurally to the inlet side of first transfer lens 62. The outlet side of lens 62 would be represented by first component 64 shown in FIG. 3.

The beams are then focused into a second image plane 104 with an orifice 105 therein located at the focal distance of the second transfer lens. A projection lens 106 receptive of the refocused beams images the same in a projection plane 108 where a channel plate electron multiplier 110 is located. Typically signals from the channel plate multiplier are conventionally detected and processed with a system (not shown) including a position sensitive device and processed for presentation as an image on a monitor or camera. Such an image shows compositional variations in a two dimensional area on sample surface 12, for a selected compositional element having a characteristic electron emission energy chosen for the monochromatic beam.

The magnetic lens, and particularly the snorkel lens, as in FIG. 2, when utilized in the orientation mode described herein and combined with the other components of the electron microscope according to the present invention, provides for a wide angle pickup and focusing of emitted electrons with low aberrations, with sufficient electron intensity for direct imaging and thus a high resolution of variation in composition along the surface. For example with X-ray photoelectrons, in an ESCA system, having energies of about 500 to 1000 electron volts, a surface spot resolution of 0.5 microns is practical. For Auger electrons, which have similar energies, the resolution should be 100–200 angstroms, being limited only by signal strength. Another substantial advantage of the high efficiency is ability to use lesser local intensity of the source beam on the surface and attendant reduced surface damage to a small spot.

The microscope is described hereinabove for mapping a plurality of spots on the sample surface. The plurality of spots generally will approach a continuum. However, it may be desirable to collect all electrons from the entire area of the multiplier 108 in order to analyze the entire surface area with a high intensity beam resulting in a high total signal. Alternatively the energy source 16, such as an electron beam, may be focused into a spot on the surface and, for example, may be scanned over the surface in a scanning mode. In either event, the microscope of the present invention is advantageously utilized as an analysis device without direct imaging, with high collection efficiency and, therefore, sensitivity.

While the invention has been described above in detail with reference to specific embodiments, various changes and modifications which fall within the spirit of the invention and scope of the appended claims will become apparent to those skilled in this art. The invention is therefore only intended to be limited by the appended claims or their equivalents.

What is claimed is:

1. A direct imaging, monochromatic electron microscope comprising emitting means for emitting electrons from a plurality of spots on a sample surface, objective lens means for collecting a substantial portion of the emitted electrons and focusing the same at an image plane, collimating lens means for collimating the substantial portion of the emitted electrons into beams, an energy filter having an entrance aperture receptive of the beams to transit monochromatic beams having a selected energy, imaging means receptive of the monochromatic beams for focusing the same to effect an image of the spots, and detector means for detecting the image, the objective lens means having a first effective position plane, the collimating lens means having a second effective position plane and a focal length relative to the second plane, the second plane being positioned at a first distance from the image plane equal to the focal length and at a second distance from the first plane, and the entrance aperture being positioned from the second plane by approximately a third distance optically conjugate to the second distance with respect to the second plane of the collimating lens means.

2. An electron microscope according to claim 1 wherein the objective lens means includes a magnetic objective lens.

3. An electron microscope according to claim 2 wherein the objective lens means comprises a magnetic field generating toroidal coil and a dish-shaped magnetically permeable member cupped coaxially over the toroidal coil.

4. An electron microscope according to claim 3 wherein the coil has a central hole therein and the permeable member has a neck portion extending substantially through the central hole.

5. An electron microscope according to claim 1 wherein the objective lens means is situated to collect the substantial portion of the emitted electrons from a sample surface interposed between the objective lens and the energy filter proximate the objective lens.

6. An electron microscope according to claim 1 wherein the energy filter comprises a spherical analyzer of hemispherical configuration with a slotted exit aperture located diametrically opposite the entrance aperture.

7. An electron microscope according to claim 1 further comprising means for selecting the energy for the monochromatic electron beams.

8. An electron microscope according to claim 1 wherein the emitting means comprises an electron gun directed at the sample surface to cause Auger electron emission from the sample surface.

9. An electron microscope according to claim 1 wherein the emitting means comprises an X-ray source directed at the sample surface to cause photoelectron emission from the sample surface.

* * * * *